United States Patent [19]

Jo et al.

[11] Patent Number: 5,036,227
[45] Date of Patent: Jul. 30, 1991

[54] ROW ADDRESS STROBE SIGNAL INPUT BUFFER FOR PREVENTING LATCH-UP

[75] Inventors: Sooin Jo, Seoul; Jaiwhan Yu, Kyungi, both of Rep. of Korea

[73] Assignee: Samsung Electronics Co., Ltd., Rep. of Korea

[21] Appl. No.: 485,911

[22] Filed: Feb. 27, 1990

[30] Foreign Application Priority Data

Nov. 18, 1989 [KR] Rep. of Korea ............... 89-16903

[51] Int. Cl.$^5$ .................. H03K 19/02; H03K 19/096
[52] U.S. Cl. .................................. 307/480; 307/451; 307/481; 307/296.5
[58] Field of Search ........ 307/443, 445, 451, 480–481, 307/296.5; 357/42; 361/91; 365/189.06, 226

[56] References Cited

U.S. PATENT DOCUMENTS

| | | | |
|---|---|---|---|
| 4,636,661 | 1/1987 | Mahmud | 307/481 |
| 4,763,023 | 8/1988 | Spence | 307/480 |
| 4,939,394 | 7/1990 | Hashimoto | 307/480 |

Primary Examiner—Stanley D. Miller
Assistant Examiner—Margaret Rose Wambach
Attorney, Agent, or Firm—Lowe, Price, LeBlanc and Becker

[57] ABSTRACT

The row address strobe signal input buffer, or "chain pre-charge" circuit, includes a pad receiving a row address strobe signal ($\overline{RAS}$). A Schmitt trigger receives the $\overline{RAS}$ signal from the pad, and is responsive to a start-up signal. A control section responds to the start-up signal and the output thereof is connected to the output of the Schmitt trigger. A NAND gate and inverters are connected to the output of the control section. A first pre-charge circuit, connected between the pad and the Schmitt trigger, prevents a floating state at the time of initial power source voltage supply. A second pre-charge circuit, connected to an input of one of the inverters which provides the output of the row address strobe signal input buffer, also helps prevent the floating state.

5 Claims, 2 Drawing Sheets

ROW ADDRESS STROBE SIGNAL INPUT BUFFER FOR PREVENTING LATCH-UP

BACKGROUND OF THE INVENTION

The present invention relates to a row address strobe signal input buffer or "chain pre-charge" circuit of a highly integrated semiconductor device, more particularly, to such a buffer for preventing generation of a latch-up state by a floating status at the time of the power source voltage supply.

As the structure of semiconductor device became highly integrated, it became necessary to include various layers and patterns which are formed by using an elaborate fine manufacturing technique. Thus, the number of MOS transistors (or memory cells) inside a semiconductor device increased while the semiconductor chip size was considerably reduced.

When an initial power source voltage is supplied to a highly integrated semiconductor device which includes a plurality of MOS transistors, a large amount of current flows into each of MOS transistors for setting an initial value, and the substrate current becomes unstable. This causes problems of latch-up in each of the MOS transistors.

So-called latch-up state occurs when the MOS transistors formed in a semiconductor chip are triggered by an external noise, and hence a direct current flows from a power source voltage terminal to a ground terminal via each of the MOS transistors. This causes a serious disadvantage in that the MOS transistors of the semiconductor device are destroyed when a highly integrated semiconductor device is considered.

Therefore, it is necessary to form a circuit for protecting the chip at the time of initial power source voltage supply. Furthermore, when the initial power source voltage is in an unstable state, chain enable signals of the row address strobe signal $\overline{RAS}$ and the Column Address Strobe signal $\overline{CAS}$, which are provided as machine cycles, are changed to a high level at the time of the power source voltage supply. Thus, the machine cycle is carried out, which causes an erroneous operation in the semiconductor device.

To resolve this problem, in the prior art, an initial start-up circuit has been built into the semiconductor device. By this, it is expected that the latch-up state at the time when an initial power source voltage is supplied be kept from occuring and that the semiconductor device be operated after the state of the DC power source voltage is maintained stable. This approach failed, however, to prevent a floating status of the chain generated during the power source voltage supply.

FIG. 1 is a diagram illustrating a conventional chain pre-charge circuit. The pad 1 is a node whereto a row address strobe signal $\overline{RAS}$ is input. The output side of the pad 1 is connected to a Schmitt trigger 2 which is able to produce the output of rectangular wave, and the output side of the Schmitt trigger 2 is connected to the gate circuit including inverters I1–I3 and a NAND gate.

In this circuit shown in FIG. 1, the pad 1 is in a floating state such that the pad can be changed into high level or low level at the beginning or during the initial power source voltage supply, hence there is some possibility that the chain enable signal $\phi R$ at the output terminal may be enabled in a high level state.

When the chain enable signal $\phi R$ is in a high level state as described above, $\overline{RAS}$ and $\overline{CAS}$ chain are operated and the latch-up state occurs. Signal $\phi 1$ is the chain feedback signal which acts as a writing signal generated at the time of the writing mode.

FIG. 2 is a circuit diagram of another conventional pre-charge circuit intended to resolve the problems in the circuit of FIG. 1. FIG. 2 shows a circuit construction for maintaining the chain enable signal $\phi R$ in a low level state at the time of power source voltage supply. More specifically, the circuit construction of FIG. 2 is basically the same as FIG. 1 except that the start-up signal $\phi 2$ of the start-up circuit is used for supplying stable power source voltage and clock signal at the time of the initial power source voltage supply.

In circuit of FIG. 2, the start-up signal $\phi 2$ is supplied to a gate of MOS transistor M1 which constitutes the Schmitt trigger 2. The MOS transistor M8 is connected between the Schmitt trigger 2 and the inverter I1, and the start-up signal $\phi 2$ is supplied to the gate of said MOS transistor M8. Furthermore, in the circuit of FIG. 2, one side of the NAND gate ND is connected to the power source voltage VCC or the signal $\phi 1$ generated at the time of the writing mode by switching means. The start-up signal $\phi 2$ is a pulse supplied from the start-up circuit, which is maintained in a high level state at the time of the power source voltage supply, and then allows the chain enable signal $\phi R$ be maintained in a low level state. When it elapses a predetermined time, after supplying the power source voltage VCC, said start-up signal $\phi 2$ transits from a high level to a low level. Thus, if the circuit of FIG. 2 is operated normally, the chain enable signal $\phi R$ becomes a high level or a low level value in accordance with the state of row address strobe signal $\overline{RAS}$ supplied to the pad 1.

The circuit shown in FIG. 2 has the following problems. First, the transition time of the start-up signal $\phi 2$ between a high level and a low level is highly variable according to the power-up rate or the value of power source voltage. Also, after the start-up signal $\phi 2$ has been changed to low level, there is some possibility of the chain enable signal $\phi R$ changing to high level in accordance with the floating status of a row address strobe signal $\overline{RAS}$ supplied to the pad 1.

Secondly, the possibility of the latch-up state is increased because the chain enable signal $\phi R$ changes more quickly from a high level state to a low level state as the power voltage VCC applied gets higher.

SUMMARY OF THE INVENTION

The present invention is intended to solve the above problems, and therefore, an object of the present invention is to provide the chain precharge circuit at the time of the power source voltage supply, which prevents an abnormal chain enable signal by making the output of the row address strobe signal input buffer pre-charged immediately within a short time.

Another object of the present invention is to provide the chain pre-charge circuit which prevents the destruction of chip by latch up by making the timing for pre-charge faster at the time of the power source voltage supply as the voltage applied gets higher. In order to achieve the above objects, the row address strobe ($\overline{RAS}$) signal input buffer or "chain precharge circuit" according to present invention comprises:

a pad receiving a row address strobe signal $\overline{RAS}$;

a Schmitt trigger connected to the output side of said pad, and receiving a start-up signal;

a control section which utilizes said start-up signal, and which is connected to the output side of said Schmitt trigger; and a NAND gate and inverters connected to the output side of said control section.

The address strobe ($\overline{RAS}$) signal input buffer further includes pre-charge means, for preventing a floating status, connected between said pad as the input side of a chip enable buffer and said Schmitt trigger and at the input side of an inverter which is used as the output side buffer of the chip enable buffer.

The pre-charge means comprises first, second, and third pre-charge circuits; and each pre-charge circuit includes an MOS transistor supplied with the pre-charge power source voltage, and which acts as a resistance.

DETAILED DESCRIPTION OF THE INVENTION

The inventive row address strobe signal ($\overline{RAS}$) input buffer, alternatively referred to as a "chain pre-charge circuit" will be described with reference to the accompanying drawing.

Figures 1, 2:
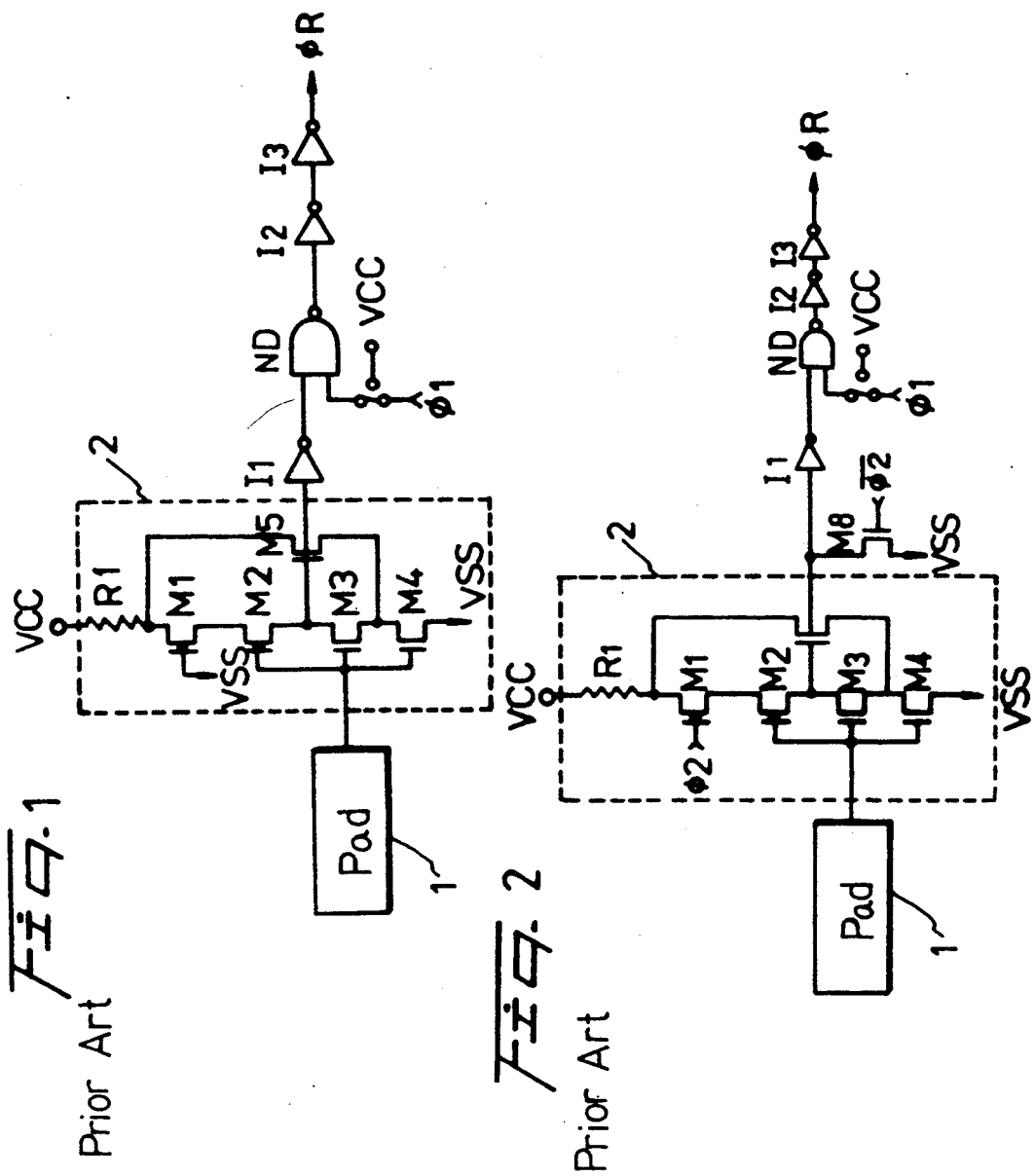
FIG. 1 is a circuit diagram according to an embodiment of a conventional chain pre-charge circuit.
FIG. 2 is a circuit diagram according to another embodiment of a conventional chain pre-charge circuit.
Figure 3:
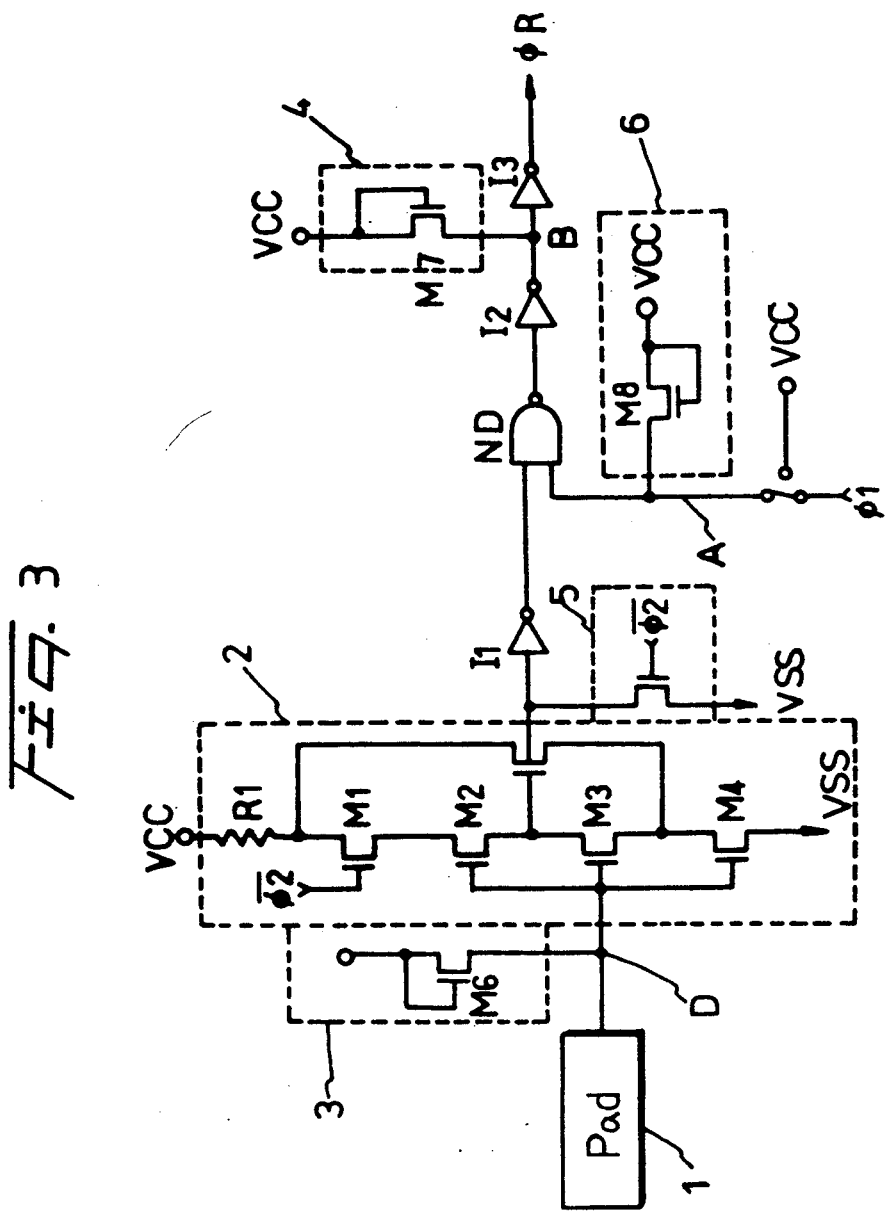
FIG. 3 is a circuit diagram according to an embodiment of the present invention.

FIG. 3 is a circuit diagram according to an embodiment of the present invention. The circuit construction in FIG. 3 is basically the same as those in FIG. 1 and FIG. 2. In the circuit of FIG. 3, the pad 1 is a node whereto the row address signal strobe signal $\overline{RAS}$ is input.

Also, this circuit of FIG. 3 has the basic construction of a row address strobe signal input buffer, that is, the output side of said pad 1 is connected to a Schmitt trigger 2 which outputs a rectangular wave signal, and the output side of said Schmitt trigger 2 is connected to a gate circuit including inverters I1–I3 and a NAND gate ND.

Moreover, a feature of the present invention is that the first pre-charge circuit 3 is connected between the pad 1 and the Schmitt trigger. Another and another feature of the present invention is that the second pre-charge circuit 4 is connected to the input side of inverter I3 which operates as a chip enable buffer. The above pre-charge circuits 3, 4 consist of MOS transistors M6 and M7 which act as resistances.

According to the circuit construction shown in FIG. 3, the A and B nodes are maintained at a high level during a short time, e.g. 10 $\mu$s even if start-up signal $\phi 2$ is varied depending on a power-up rate and the power-up voltage level. Also, the third pre-charge circuit 3 for maintaining the node B at the high level is connected to the input side of the NAND gate ND.

As can be seen from the above circuit construction, nodes A and B are maintained at the high level by means of the pre-charge circuit for a short time, so that the chain enable signal $\phi R$, the last output, is kept at low level under the pre-charge state. Thus, even if the row address strobe signal $\overline{RAS}$ gets into a floating state, it is still possible to prevent the chain enable signal operating erroneously at a high level.

When the MOS transistor M7 of the second pre-charge circuit 4 which is connected to the front side of the inverter I3 is turned on at the time of power voltage supply, the node B is kept at high level, then an inverted chain enable signal $\phi R$ of low level is generated at the output of inverter I3. Here, the MOS transistor M7 acts as a resistance.

Also, in the third pre-charge circuit 6 which is connected to one side of the NAND gate ND, when the MOS transistor M8 which acts as a resistance is turned on at the time of power source voltage supply, one side of the NAND gate ND is maintained at high level. At this time, another side of NAND gate ND outputs low level state because the transition of the high level state through the inverter I1 is maintained.

Accordingly, this output signal is generated as a chain enable signal of low level through the inverters I2 and I3 and executes the precharging action which prevents the erroneous operation from occurring.

Also, the first pre-charge circuit 3 connected to the output side of said pad 1 basically prevents the chip enable pad from floating after the power source voltage supply. That is, at the time of the power source voltage supply, the MOS transistor M6 of the first pre-charge circuit 3, which acts as an resistance, is turned on and pre-charges the node D and maintains node D at high level state. The pad 1 therefore is kept from floating at low level.

A high level signal from node D turns on MOS transistors M3, M4 of the Schmitt trigger 2, and the MOS transistor M5 is maintained turned off accordingly. Therefore, the node C at the front end of the inverter I1 is changed to low level, and a chain enable signal $\phi R$ is finally pre-charged at low level through said NAND gate ND and the inverters I2 and I3 which operate as buffers.

The start-up signal $\phi 2$ is supplied to the gate of MOS transistor M1 in Schmitt trigger 2, and the start-up signal $\phi 2$ is supplied to the control circuit 5 formed at the front side of the inverter I1. These start-up signals are input as high level signals in a conventional start-up circuit, like that shown in FIG. 2, at the time of the initial power source voltage supply and serve to maintain the chain enable signal $\phi R$ to low level. Also, an end of the NAND gate ND whereto the power source voltage VCC and writing signal $\phi 1$ are applied alternately through an analog switch is formed so that it may operate in the same way as that shown in FIG. 1 and FIG. 2.

According to the present invention, it is possible to prevent the erroneous operation by making the chain enable signal $\phi R$ pre-charged to a low level, at the time of the power source voltage supply, by means of the first, the second and the third pre-charge circuits. Here, the delay time of the first pre-charge circuit 3 is equal to the resistance component of the MOS transistor M6 times the capacitance plus the loading capacitance of the pad 1. The multiple value is set at 15 $\mu$s when VCC=4. In this case, because the delay time gets shorter as the power source supply voltage increases, it is quite good in preventing latch-up. The delay time according to the size of MOS transistor M6 is shown in the following table 1.

TABLE 1

| Size of MOS transistor M6 | Current (6 V, −5° C.) ($\overline{RAS}$ = 0 V) | 4 V/80° C. | Delay time for $\overline{RAS}$ = 2.0 V 5 V/80° C. | 6 V/80° C. | 7 V/80° C. |
| --- | --- | --- | --- | --- | --- |
| 3/500 | 5.5 μA | 11.8 μs | 7.1 μs | 5.9 μs | 5.4 μs |
| 3/600 | 4.6 μA | 13.7 μs | 7.7 μs | 6.1 μs | 5.5 μs |

Here, the delay time of MOS transistor M6 is 0 μs, and the capacitance of the $\overline{RAS}$ pad 1 is 3 pF.

The sizes of MOS transistors M7, M8 in the second pre-charge circuit 4 and the third pre-charge 6 are chosen such that a current level of several tens of μA may flow under conditions where the power source voltage is 6 V and the temperature is −5° C., and the drive current may not be influenced thereby.

Accordingly, since the loading capacitance of nodes A, B are smaller than the capacitance of the node D, at the time of a initial power source voltage supply or a power source voltage supply, the second pre-charge circuit 4 and the third pre-charge circuit 6 are operated first to have the chain enable signal φR pre-charged. Subsequently, the first pre-charge circuit 3 is subsequently operated to have the chain enable φR pre-charged. By this, the erroneous operation of the chain can be prevented.

The row address strobe signal ($\overline{RAS}$) input buffer in a semiconductor DRAM, which is operated as described above, makes the chain of the row address strobe signal $\overline{RAS}$ and the column address strobe signal $\overline{CAS}$ operate. By this, it is possible to prevent the chain from erroneous operation at the time of the initial power source voltage supply or during the power supply.

As above described, in order to prevent the erroneous operation caused by floating status of the chip enable pad in a row address strobe input buffer at the time of the power-up or after a power source voltage supply, the circuit according to the present invention comprises the first pre-charge circuit which is provided in the chip enable buffer so as to prevent the floating status and the second pre-charge circuit which is connected to the front end of the output side of the chip enable buffer. Thus, the chain is prevented from being enabled by the floating of the row address strobe signal. Also, latch up can be prevented by precharging more rapidly when a power source of high voltage VCC is to be applied.

What is claimed is:

1. A row address strobe signal input buffer comprising:
   a pad receiving an input row address strobe signal;
   a Schmitt trigger means connected to receive said row address strobe signal from said pad, and responsive to a start-up signal;
   a control section responsive to said start-up signal, and connected to an output of said Schmitt trigger means;
   a NAND gate and inverters connected to an output of said control section;
   a first pre-charge means for preventing a floating state at the time of power source voltage supply, said first pre-charge means being connected between said pad and said Schmitt trigger; and
   a second pre-charge means for preventing a floating state connected to an input of one of said inverters which provides an output of the row address strobe signal input buffer.

2. A buffer according to claim 1, wherein said first pre-charge means includes a MOS transistor which operates as a resistance to limit a current level between a power source voltage and said pad for receiving a row address strobe signal.

3. A buffer according to claim 1, wherein said second pre-charge means includes a MOS transistor which operates as a resistance to limit a current level between a power source voltage and said said one of said inverters.

4. A buffer according to claim 1, further comprising a third pre-charge means which operates as a resistance, said third pre-charge means being connected to one end of said NAND gate.

5. A buffer according to claim 4, wherein each of the pre-charge means comprises a MOS transistor, and the size of the MOS transistor of said first pre-charge means is larger and exhibits a larger loading capacitance than the MOS transistors of said second and third pre-charge means.

* * * * *